SEMICONDUCTOR DEVICES AND METHODS OF MAKING THEM

Filed April 15, 1959

INVENTORS
EUGENE L. JORDAN &
DANIEL J. DONAHUE
BY W. S. Hill
AGENT

United States Patent Office 3,089,793

Patented May 14, 1963

3,089,793

SEMICONDUCTOR DEVICES AND METHODS OF MAKING THEM

Eugene L. Jordan, Bound Brook, and Daniel J. Donahue, Somerville, N.J., assignors to Radio Corporation of America, a corporation of Delaware Filed Apr. 15, 1959, Ser. No. 806,683
14 Claims. (Cl. 148—1.5)

Figure 1A:
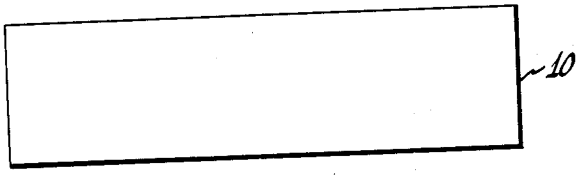

This invention relates to an improved method of making semiconductor devices. More particularly, the invention relates to an improved method of controlling the size and shape of rectifying barriers in bodies of semiconductive materials.

One method of making junction type semiconductor devices includes the step of heating a given conductivity type semiconductive body in an ambient containing a type-determining substance capable of imparting opposite conductivity type to the particular semiconductor employed. The ambient is usually a vapor, but may be a liquid. The conductivity type-determining substance, which may be an acceptor or a donor and is also known in the art as an impurity, diffuses from the ambient into the semiconductive body to a depth determined by the temperature and duration of heating, and the diffusion constant of the impurity in the semiconductor. Since a surface layer of the semiconductive body is thereby converted to opposite conductivity type, a rectifying barrier known as a PN junction is formed at the interface between the given conductivity type bulk of the wafer and the impurity-diffused surface layer. The rectifying barrier thus produced extends over the entire surface of the wafer unless portions of the surface are masked to confine the diffusion to a particular area. However, in the fabrication of semiconductor devices such as transistors and the like, it is necessary to control with precision the size and shape of the rectifying barriers formed in the semiconductive wafer. Since these devices are inherently small, such precise control is difficult to attain.

It is known to control the size and shape of rectifying barriers formed in a semiconductor wafer by masking portions of the wafer surface with a semiconductor oxide coating prior to the diffusion step. The impurity material diffuses selectively into the wafer, with diffusion being considerably faster in those regions of the wafer which are not masked than in the regions underlying portions masked with the oxide coating. The oxide coating may be genetically derived from the semiconductor body itself, for example by heating a silicon wafer in the presence of an oxidizing agent so as to convert a surface layer of the silicon to silicon oxide. The oxidant may be water vapor, as described in U.S. 2,802,760. This method is not suitable for other semiconductors such as germanium and the III–V compounds, which are more sensitive to oxidation than silicon. Germanium oxide sublimes at the temperatures required for diffusion, and thus cannot be utilized as a diffusion mask. Furthermore, the thickness of the semiconductor wafer is reduced by a variable amount, depending on the thickness of the oxidized layer. This introduces an undesirable variation in the distance between rectifying barriers and hence in the electrical characteristics of devices made from such wafers.

Another method of forming an oxide coating is by vacuum evaporation of the oxide over the semiconductor wafer, which may be masked so that only preselected areas of the wafer surface are covered by the oxide. This method has the advantage that the semiconductor wafer itself is kept at a low temperature in vacuum, and hence is neither injured by the coating step nor altered in thickness. The method may be used to restrict the lateral spreading of surface alloyed electrodes, as described and claimed in U.S. 2,796,562, assigned to the same assignee. Still another advantage of this method is that the oxide coating need not be the oxide of the particular semiconductor utilized; for example, a coating of silicon dioxide may be vacuum evaporated on a germanium wafer. However, it has been found that while such silicon dioxide coatings are satisfactory for alloying methods, they are not sufficiently adherent on germanium wafers, and do not give satisfactory results in diffusion processes. The vacuum evaporated dioxide coatings are also sometimes affected by the action of solvents such as water and acetone, which are used in semiconductor device fabrication. Silicon monoxide coatings are much more adherent than silicon dioxide, but it has been found difficult to remove monoxide coatings without injuring the semiconductor surface.

It is therefore an object of this invention to provide an improved method of fabricating semiconductor devices.

Another object of the invention is to provide an improved method of introducing rectifying barriers in semiconductive wafers.

Yet another object is to provide an improved method of diffusing a type-determining substance into a semiconductive wafer.

Still another object is to provide an improved method of controlling the size and shape of rectifying barriers in semiconductor devices.

The prior art disadvantages mentioned above are avoided by the instant invention in the following manner. A suitably prepared semiconductor wafer is heated in the vapors of an organic siloxane compound at a temperature below the melting point of the semiconductor but above that at which the compound decomposes, so that an inert adherent coating is formed on the wafer surface. The precise nature of the coating is not certain, but it is believed to be principally silicon oxide. A selected portion of the silicon oxide coating is then removed. The wafer is subsequently treated with a conductivity type-determining substance which diffuses differentially into the wafer, the diffusion proceeding very slowly in those portions of the wafer which underlie the silicon oxide coating. When the process is completed, the silicon oxide coating thus prepared may be readily removed without injuring the wafer surface.

Figure 1B:
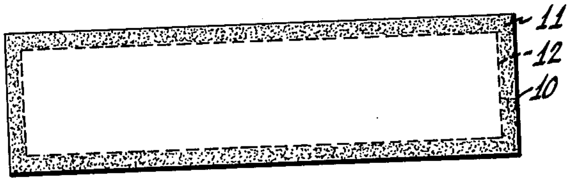
Figure 1C:
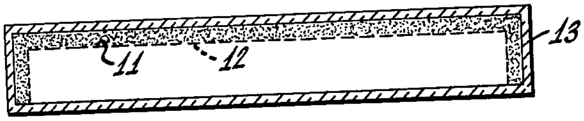
Figure 1D:
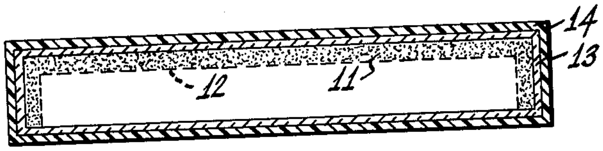
Figure 1E:
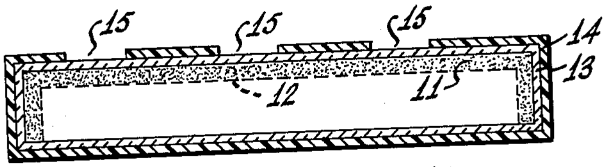
Figure 1F:
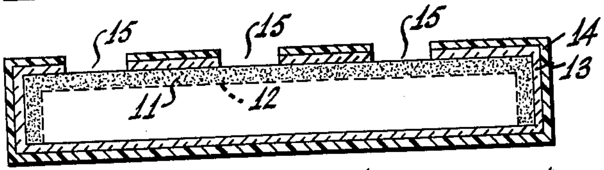
Figure 1G:
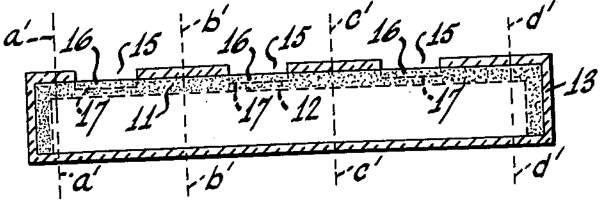
Figure 2:
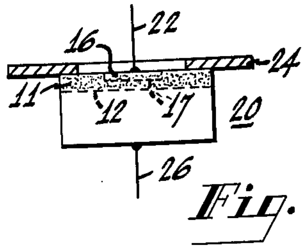

The invention will be described in greater detail in connection with the accompanying drawing, in which:

FIGURES 1*a*–1*f* are cross-sectional schematic views of successive steps in the fabrication of a semiconductor device in accordance with the invention; and, FIGURE 2 is a cross-sectional view of the completed device made according to the method of FIGURE 1.

Similar reference numerals have been applied to similar elements throughout the drawing.

A preferred example of the method will set forth the preparation of an NPN transistor. However, it is to be understood that the method is equally applicable to the fabrication of PNP units, and to the manufacture of other semiconductor devices such as tetrodes, diodes, and the like.

*Example I*

Referring to FIGURE 1*a*, a wafer or body 10 of semiconductive material of either conductivity type is prepared by conventional methods. For example, a monocrystalline ingot is formed of highly purified germanium. The ingot is cut into transverse slices which are lapped to make the major faces flat and parallel. The slices are then etched to remove surface debris and reduce each slice to the desired thickness, and may be used as such or diced into wafer. The exact size of the resulting wafer is not critical. In this example, slice or wafer 10 is made of N-conductivity type germanium about 6 mils thick, and has a resistivity of about 0.1–2.0 ohm-centimeters.

Referring to FIGURE 1*b*, a surface zone 11 of wafer 10 is converted to P-conductivity type by diffusing an acceptor therein. This may be accomplished by heating the wafer while it is immersed in a source powder composed of 99.9% germanium-0.1% indium, in the manner described in U.S. 2,870,050, assigned to the same assignee. The thickness of the converted surface region depends inter alia on the concentration of the source powder, the particle size of the powder, and the temperature and duration of heating. In this example, these parameters are adjusted so that the P-type region 11 is about 0.1 mil thick. A PN junction 12 is formed at the interface between the P-type surface zone 11 and the N-type bulk of wafer 10.

Referring to FIGURE 1*c*, the diffused region on one major face of wafer 10 is reduced by grinding and etching the wafer to half the original wafer thickness. The wafer is next heated in the vapors or fumes of an organic siloxane compound so as to deposit a silicon oxide coating 13 over the wafer 10. Heating is performed at a temperature above that at which the siloxane decomposes, but below the melting point of the semiconductor, Since semiconductors such as germanium have a melting point above 900° C., while siloxanes generally begin to decompose at 600° C., it will be seen that any siloxane can be used, and a wide temperature range is available for this step. The temperature range of 650° C. to 800° C. may be used for this step when the wafer is germanium. In this example, the wafer 10 is heated for 10–15 minutes at 700° C. in a quartz furnace containing ethyl triethoxysilane. Argon is used as the carrier gas to sweep the siloxane fumes through the furnace, since oxygen must be excluded. Other siloxanes such as dimethyl diethoxysilane, tetraethoxysilane, amyl triethoxysilane, phenyl triethoxysilane, diphenyl diethoxysilane, and vinyl triethoxysilane may be utilized. The precise nature of the silicon oxide coating 13 is uncertain, but it is believed to be a mixture of silicon monoxide and silicon dioxide.

Referring to FIGURE 1*d*, the entire surface of wafer 10 is masked by means of an acid resist layer 14. In this example, the acid resist consists of apiezon wax, which is sprayed on as a solution and allowed to dry. A series of lines 15 which are about 1 mil wide and 30 mils apart are then scribed in the acid resist layer 14 across the entire wafer 10, as shown in FIGURE 1*e*.

The wafer 10 is now immersed in an etchant. In this example, the etchant is 5% hydrofluoric acid. The etchant dissolves those portions of the silicon oxide coating 13 which are not protected by the wax layer 14, leaving the wafer as shown in FIGURE 1*f*.

Referring to FIGURE 1*g*, the wax layer 14 is dissolved by a solvent such as carbon disulfide or trichlorethylene. The wafer 10 is then heated in a source powder containing a donor. In this example, wafer 10 is heated in a powder composed of 95% germanium-5% arsenic for about 30 minutes at about 700° C. The portion of the silicon oxide coating 13 which remains on the wafer acts as a mask against the diffusion of arsenic. Under these conditions, arsenic diffuses into the wafer to a depth of 0.05 mil in those regions 16 which correspond to the lines 15 previously scribed in the acid resist 14. PN junctions 17 are formed at the boundary between the arsenic-diffused regions 16 and P-type zone 11.

To complete the process, the wafer 10 is washed in hydrofluoric acid to remove the remainder of the silicon oxide coating, and is then diced along the planes A′—A′, B′—B′, C′—C′, and D′—D′, forming individual units as illustrated in FIGURE 2.

Referring now to FIGURE 2, the unit 20 is completed by attaching an emitter lead 22 to the N-type diffused region 16, a base tab 24 to the P-type diffused region 11 surrounding N-type region 16, and a collector lead 26 to the opposite wafer face.

While the device thus prepared is a bipolar triode transistor, it will be understood that the invention is not limited to transistors, and may also be utilized to fabricate diodes, unipolar devices, tetrodes, and other multiple junction units. In the above example, N-type germanium was used as the starting material, but this was used by way of illustration only, and not as a limitation. It is equally feasible to begin with a slice of P-conductivity type germanium and fabricate PNP units. Other donors such as antimony and phosphorus may be utilized instead of arsenic, and other acceptors such as aluminum and gallium in place of indium. The invention may also be practiced with P-type or N-type wafers of the semiconductive materials known as the III–V compounds, which include the phosphides, arsenides, and antimonides of aluminum, gallium and indium.

Other variations may be made without departing from the spirit and scope of the invention. For example, predetermined portions of the silicon oxide coating may be removed by means of grinding wheels, instead of the acid resist technique described above. Alternatively, the silicon oxide coating may be covered with a layer of photoresist, and predetermined portions of the photoresist layer exposed to light. The unexposed portions of the photoresist are then removed. Those portions of the silicon oxide coating not covered by the photoresist are etched away, and the remaining portion of the silicon oxide coating serves as a diffusion mask. This technique is particularly suitable for the fabrication of mesa type units.

What is claimed is:

1. The method of fabricating a semiconductor device comprising the steps of depositing a silicon oxide coating on the surface of a semiconductive wafer by excluding oxygen while heating said wafer in the vapors of a siloxane compound at a temperature below the melting point of said wafer but above the decomposition temperature of said compound, removing a predetermined portion of said silicon oxide coating, and treating said wafer with the vapors of a conductivity type-determining substance so as to introduce said substance into the coating-free portion of said wafer.

2. The method as in claim 1, in which said wafer is P-type germanium and said type-determining substance is capable of converting said wafer to N-conductivity type.

3. The method as in claim 1, in which said wafer is a member of the group consisting of the phosphides, arsenides and antimonides of aluminum, gallium and indium.

4. The method as in claim 1, in which said wafer is subsequently treated with hydrofluoric acid to remove the remaining portion of said silicon oxide coating.

5. The method of fabricating a semiconductor device comprising the steps of excluding oxygen while heating a germanium wafer in the vapors of a siloxane compound at a temperature below the melting point of germanium but above the decomposition temperature of said siloxane so as to cover the wafer surface with a silicon oxide coating, removing a selected portion of said coating, and exposing both the coated and uncoated portions of said wafer surface to the vapors of a substance selected from the class consisting of arsenic, antimony, phosphorus, aluminum, and gallium.

6. The method of fabricating a semiconductor device comprising the steps of excluding oxygen while heating a semiconductive body in the vapors of a siloxane compound so as to form a silicon oxide coating thereupon, said heating being performed at a temperature below the melting point of said body but above the decomposition temperature of said siloxane, removing a selected portion of said coating so as to expose predetermined portions of said body, and reheating said body in the vapors of a conductivity type-determining substance which will diffuse differentially in those regions of the body underlying portions where the silicon oxide coating was removed and in those regions of the body underlying portions where the silicon oxide coating was not removed.

7. The process of fabricating a semiconductor device comprising the steps of excluding oxygen while heating a germanium wafer in the vapors of a siloxane compound so as to form a silicon oxide coating upon the surface of said wafer, said heating being performed at a temperature of about 650° C. to 800° C., removing said silicon oxide coating from selected portions of said wafer, and reheating said wafer in the vapors of a conductivity type-determining substance which will diffuse differentially in those regions of said wafer underlying portions where said silicon oxide film was removed and in those regions of said wafer underlying portions where said silicon oxide was not removed.

8. The method of fabricating a semiconductor device comprising the steps of excluding oxygen while heating a semiconductive wafer in the vapors of a siloxane compound at a temperature below the melting point of said wafer but above the decomposition temperature of said compound so as to cover said wafer with a silicon oxide coating, masking selected portions of said coating, removing the unmasked portions of said coating so as to expose the corresponding portions of the wafer surface, and treating said exposed portions of the wafer surface with vapors of a conductivity type-determining substance.

9. The method of fabricating a semiconductor device comprising the steps of excluding oxygen while heating a semiconductive wafer in the vapors of a siloxane compound at a temperature below the melting point of said wafer but above the decomposition temperature of said compound so as to cover said wafer with a silicon oxide coating, masking selected portions of said coating with an acid-resist, treating said wafer with hydrofluoric acid to remove the unmasked portions of said coating and expose the corresponding portions of the wafer surface, treating said wafer with a solvent to remove said acid-resist, and treating said exposed portion of said wafer surface with a conductivity type-determining substance to form a rectifying barrier therebeneath.

10. The method according to claim 9 in which said wafer is a member of the group consisting of the phosphides, arsenides and antimonides of aluminum, gallium and indium.

11. The method according to claim 9 in which said semiconductor wafer is made of N-type germanium and said type-determining substance is capable of converting said wafer to P-conductivity type.

12. The method according to claim 9 in which said wafer is heated in the vapors of a siloxane compound at a temperature of about 650° C. to 800° C., and said acid-resist is wax.

13. The method according to claim 9 in which said wafer is subsequently treated with hydrofluoric acid to remove the remaining portion of said silicon oxide coating.

14. The method of fabricating a semiconductor device comprising the steps of excluding oxygen while heating a semiconductive wafer in the vapors of a siloxane compound at a temperature below the melting point of said wafer but above the decomposition temperature of said compound so as to cover said wafer with a silicon oxide coating, depositing a layer of photoresist over said coating, exposing preselected areas of said photoresist to light, removing the unexposed portions of said photoresist, treating said wafer with hydrofluoric acid to remove those portions of said oxide coating not covered by said photoresist and thus expose the corresponding portions of said wafer surface, removing the remaining portions of said photoresist, and treating said exposed portion of said wafer surface with a conductivity type-determining substance to form a rectifying barrier therebeneath.

References Cited in the file of this patent

UNITED STATES PATENTS

| | | |
|---|---|---|
| 2,215,128 | Meulendyke | Sept. 17, 1940 |
| 2,726,172 | Bennett et al. | Dec. 6, 1955 |
| 2,796,562 | Ellis et al. | June 18, 1957 |
| 2,802,760 | Derick et al. | Aug. 13, 1957 |
| 2,804,405 | Derick et al. | Aug. 27, 1957 |
| 2,816,847 | Shockley | Dec. 17, 1957 |
| 2,816,850 | Haring | Dec. 17, 1957 |
| 2,841,510 | Mayer | July 1, 1958 |
| 2,846,340 | Jenny | Aug. 5, 1958 |
| 2,874,076 | Schwartz | Feb. 17, 1959 |
| 2,911,539 | Tanenbaum | Nov. 3, 1959 |
| 2,912,312 | Japel | Nov. 10, 1959 |
| 2,913,358 | Harrington et al. | Nov. 17, 1959 |